United States Patent
Chen et al.

(10) Patent No.: US 10,965,855 B2
(45) Date of Patent: Mar. 30, 2021

(54) LENS MODULE

(71) Applicant: TRIPLE WIN TECHNOLOGY(SHENZHEN) CO.LTD., Shenzhen (CN)

(72) Inventors: Shin-Wen Chen, New Taipei (TW); Long-Fei Zhang, Guangdong (CN); Kun Li, Guangdong (CN); Xiao-Mei Ma, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 19 days.

(21) Appl. No.: 16/438,658

(22) Filed: Jun. 12, 2019

(65) Prior Publication Data

US 2020/0358936 A1 Nov. 12, 2020

(30) Foreign Application Priority Data

May 9, 2019 (CN) .......................... 201910385077.8

(51) Int. Cl.
| | |
|---|---|
| *H05K 1/00* | (2006.01) |
| *H04N 5/225* | (2006.01) |
| *H05K 1/14* | (2006.01) |
| *H05K 1/11* | (2006.01) |

(Continued)

(52) U.S. Cl.
CPC ......... *H04N 5/2257* (2013.01); *H04N 5/2253* (2013.01); *H04N 5/2254* (2013.01); *H05K 1/0281* (2013.01); *H05K 1/0306* (2013.01); *H05K 1/115* (2013.01); *H05K 1/118* (2013.01); *H05K 1/144* (2013.01);
(Continued)

(58) Field of Classification Search
CPC .. H04N 5/2257; H04N 5/2253; H04N 5/2254; H05K 1/0281; H05K 1/115; H05K 1/144; H05K 1/118; H05K 1/0306; H05K 2201/10121; H05K 2201/10151; H05K 2201/041
See application file for complete search history.

(56) References Cited

U.S. PATENT DOCUMENTS 10,473,886 B2 * 11/2019 Park ..................... G02B 27/646
2012/0044411 A1 * 2/2012 Wang ................... H04N 5/2257
348/374
(Continued)

FOREIGN PATENT DOCUMENTS

| CN | 205961265 U | 2/2017 |
|---|---|---|
| CN | 207799306 U | 8/2018 |

*Primary Examiner* — Yuriy Semenenko
(74) *Attorney, Agent, or Firm* — ScienBiziP, P.C.

(57) ABSTRACT

A lens module includes a first circuit board, a second circuit board, an image sensor, a signal line, a mounting bracket, a filter, and a lens unit. The first circuit board defines a first through hole. The second circuit board is coupled to the first circuit board. The second circuit board defines a second through hole aligned with the first through hole. A width of the first through hole is larger than a width of the second through hole. The image sensor is received in the second through hole. The signal line couples the image sensor to the second circuit board. The mounting bracket is disposed on a side of the first circuit board facing away from the second circuit board. The filter is disposed on the mounting bracket. The lens unit is disposed on the mounting bracket.

18 Claims, 4 Drawing Sheets

(51) Int. Cl.
H05K 1/02 (2006.01)
H05K 1/03 (2006.01)

(52) U.S. Cl.
CPC ............... *H05K 2201/041* (2013.01); *H05K 2201/10121* (2013.01); *H05K 2201/10151* (2013.01)

(56) References Cited

U.S. PATENT DOCUMENTS

| | | | |
|---|---|---|---|
| 2016/0178925 A1* | 6/2016 | Park | G02B 27/646 |
| | | | 359/557 |
| 2016/0241763 A1* | 8/2016 | Jung | H04N 5/2257 |
| 2018/0063420 A1* | 3/2018 | Kang | H04N 5/23218 |
| 2019/0373729 A1* | 12/2019 | Park | H05K 1/0243 |

* cited by examiner

LENS MODULE

FIELD

The subject matter herein generally relates to lens modules, and more particularly to a lens module having a reduced size.

BACKGROUND

Generally, lens modules include a lens, a lens base, a bracket, a filter, a sensor chip, and a circuit board. One method of reducing a size of the lens module is to open a hole in the middle of the circuit board, place a steel sheet on the bottom of the circuit board, and attach the sensor chip to the steel sheet. In this way, the thickness of the lens module is reduced. However, since a gold wire between the sensor chip and the circuit board has a certain height, a thickness of the lens module is difficult to further reduce.

BRIEF DESCRIPTION OF THE DRAWINGS

Implementations of the present disclosure will now be described, by way of embodiments, with reference to the attached figures.

DETAILED DESCRIPTION

Figure 1:
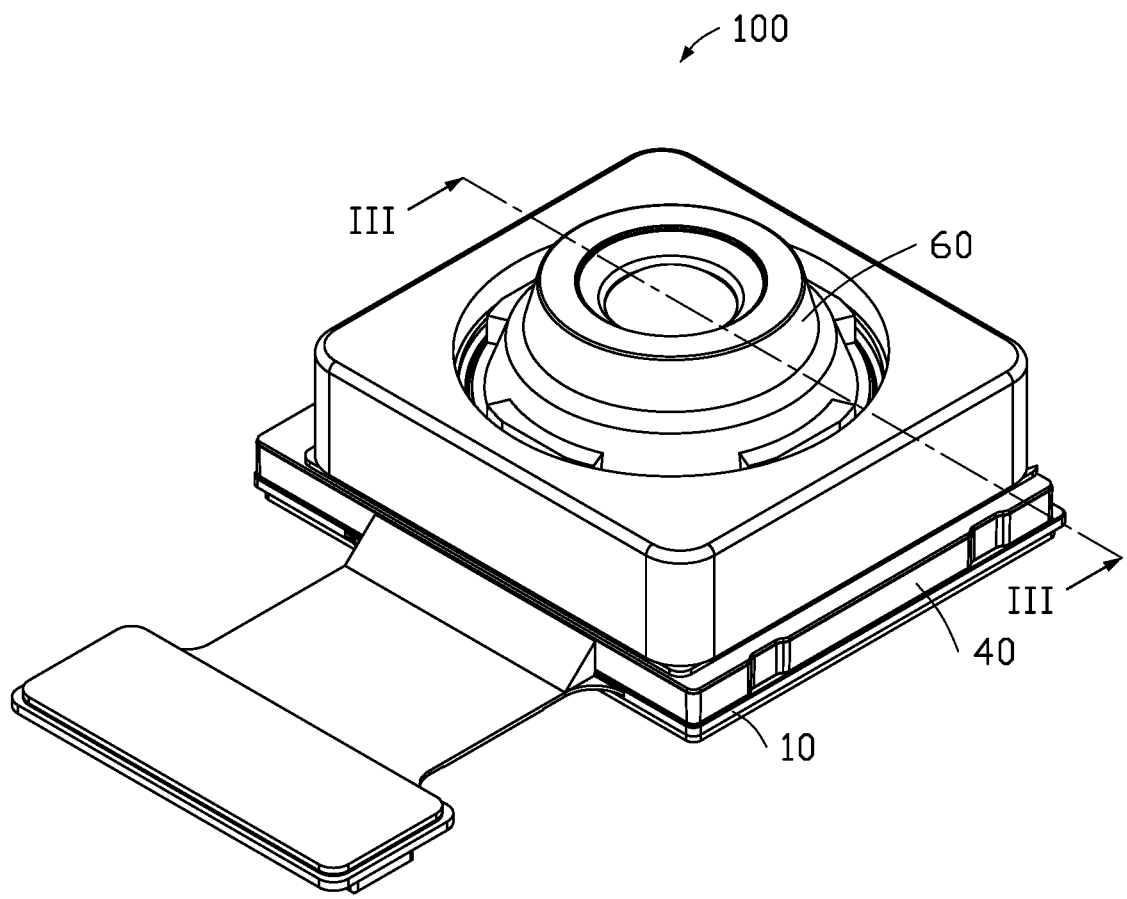
FIG. 1 is an assembled, isometric view of an embodiment of a lens module.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
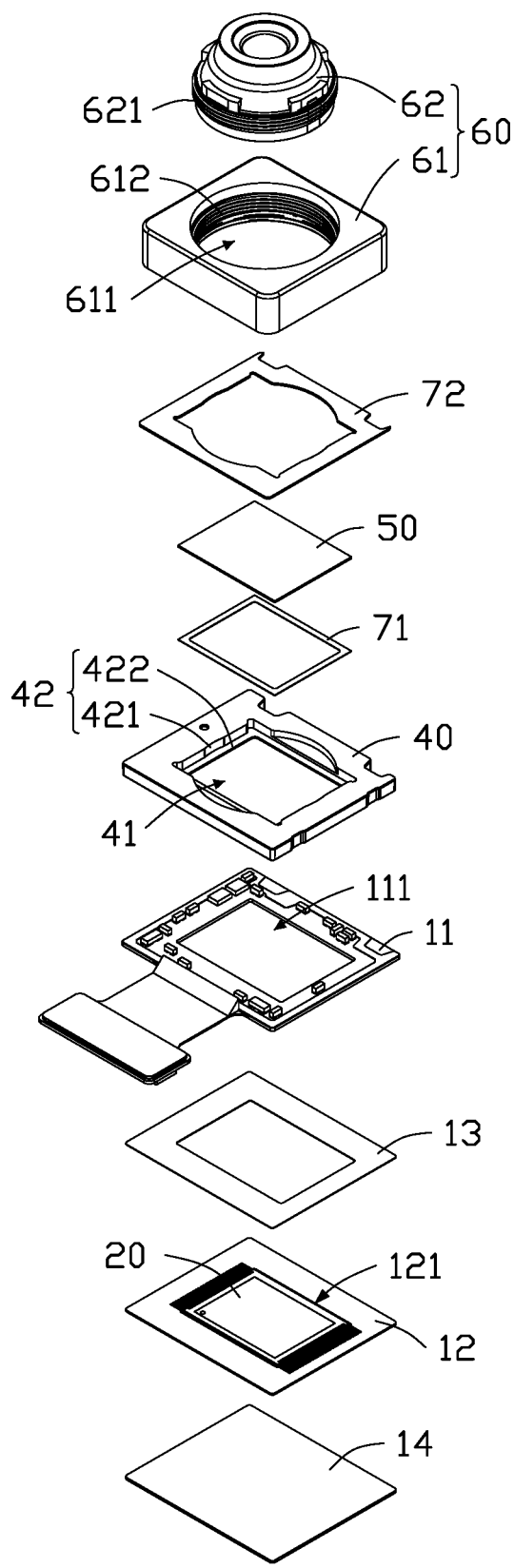
FIG. 2 is an exploded, isometric view of the lens module of FIG. 1.
Figure 3:
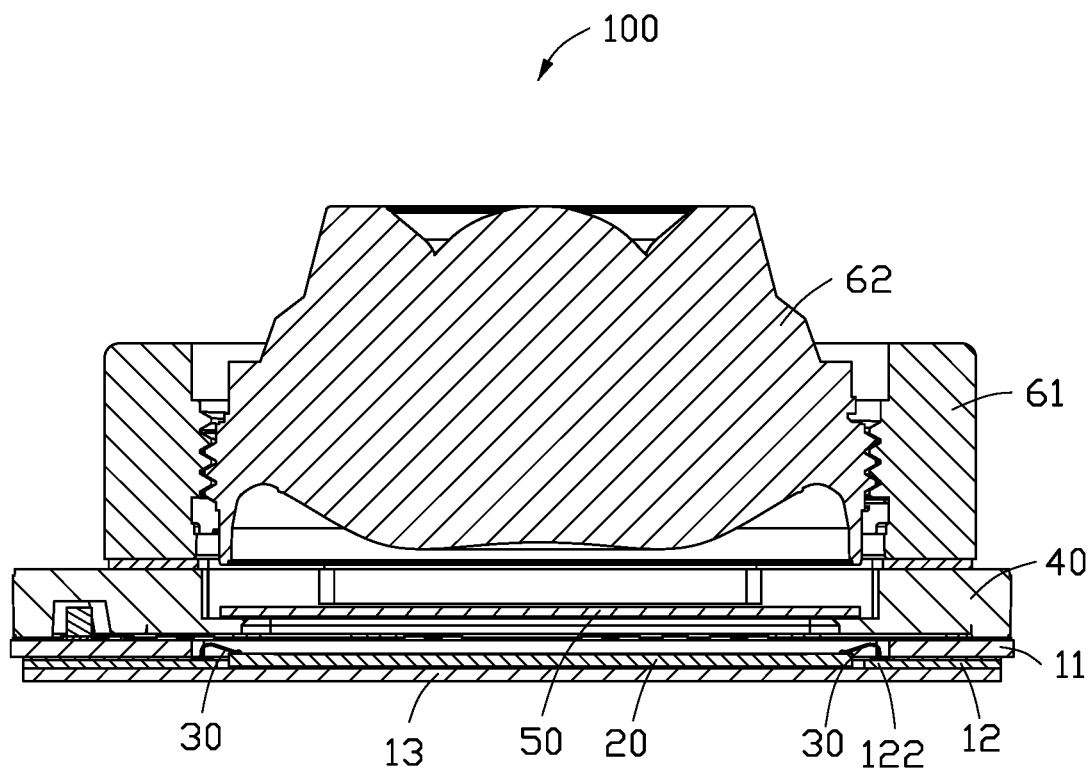
FIG. 3 is a cross-sectional view taken along line of FIG. 1.

FIGS. 1-3 show an embodiment of a lens module 100, which is applied in an electronic device (not shown). The electronic device can be a smart phone, a tablet computer, or the like. The lens module 100 includes a circuit board 10, an image sensor 20, a signal line 30, a mounting bracket 40, a filter 50, and a lens unit 60.

The circuit board 10 can be a flexible circuit board, a rigid circuit board, or a combination of the two. In one embodiment, the circuit board 10 includes a first circuit board 11 and a second circuit board 12. The second circuit board 12 is bonded to and electrically coupled to the first circuit board 11. The second circuit board 12 is located on a side of the first circuit board 11 facing away from the lens unit 60. A first through hole 111 is defined in the first circuit board 11, and a second through hole 121 corresponding to the first through hole 111 is defined in the second circuit board 12. A width of the first through hole 111 is larger than a width of the second through hole 121, such that the portion of the second circuit board 12 adjacent to the second through hole 121 is not shielded by the first circuit board 11, thereby forming a signal line connecting portion 122.

In one embodiment, the first circuit board 11 is a printed circuit board (PCB), and the second circuit board 12 is a flexible printed circuit (FPC). The lens module 100 further includes a conductive adhesive layer 13 disposed between the first circuit board 11 and the second circuit board 12. The conductive adhesive layer 13 bonds the first circuit board 11 and the second circuit board 12 together. In one embodiment, the adhesive layer is an anisotropic conductive film (ACF).

The lens module 100 further includes a reinforcement plate 14 disposed on a side of the second circuit board 12 facing away from the first circuit board 11. In one embodiment, the reinforcement plate 14 is a stainless steel piece, but is not limited thereto. The reinforcement plate 14 may be a metal plate such as an aluminum plate, a steel plate, an iron plate, a copper plate, a tempered glass plate, or the like.

The image sensor 20 is disposed on the reinforcement plate 14 and received in the second through hole 121 of the second circuit board 12. The image sensor 20 includes an integrated image sensor and an image signal processing chip (ISP Chip). A photosensitive element of the image sensor 20 can be a charge coupled device (CCD) or a complementary metal-oxide semiconductor (CMOS). The image sensor 20 receives light from the lens unit 60 and generates a corresponding electrical image signal.

One end of the signal line 30 is disposed on the second circuit board 12, and a second end of the signal line 30 is coupled to the image sensor 20. The signal line 30 implements connection and signal transmission between the image sensor 20 and the circuit board 10. In one embodiment, the signal line 30 is a gold wire, but is not limited thereto. The signal line 30 may also be an aluminum wire, a copper wire, a silver wire, or the like.

In one embodiment, one end of the signal line 30 is disposed on the signal line connecting portion 122.

In one embodiment, a top of the signal line 30 can be received in the first through hole 111 of the first circuit board 11, that is, a height of the signal line 30 can be lower than a height of the first circuit board 11 to reduce a thickness of the lens module 100.

It should be understood that a quantity of signal lines 30 may be the same as a quantity of sensing pads on the second circuit board 12. A plurality of signal lines 30 may be located on opposite sides of the second through hole 111.

The mounting bracket 40 is disposed on a side of the first circuit board 11 facing away from the second circuit board 12. In one embodiment, the mounting bracket 40 is substantially rectangular. A mounting hole 41 is defined in a substantially middle portion of the mounting bracket 40. The mounting bracket 40 includes a sidewall 42 surrounding the mounting hole 41. The sidewall 42 includes a side surface 421 and a support portion 422. The support portion 422 is coupled perpendicularly to the side surface 421. The support portion 422 extends from the side surface 421 toward the mounting hole 41.

The filter 50 is disposed on the support portion 422 facing the image sensor 20. Since the mounting bracket 40 and the filter 50 are disposed covering the image sensor 20, foreign matter such as dust is prevented from falling onto the image sensor 20 to protect the image sensor 20.

The lens unit 60 includes a lens holder 61 and a lens 62 mounted on the lens holder 61 disposed on the mounting bracket 40. In one embodiment, the lens holder 61 is substantially rectangular. A circular receiving hole 611 is defined in a substantially middle portion of the lens holder 61. An inner thread 612 is formed on a sidewall of the receiving hole 611.

An outer thread 621 is formed on an outer side of the lens 62. The lens 62 is received in the receiving hole 611 of the lens holder 61, and the outer thread 621 is coupled to the internal thread 611. The lens 62 faces a side of the filter 50 facing away from the image sensor 20. In one embodiment, the lens 62 and the lens base 61 may be snap-fitted or secured by glue. In one embodiment, the lens base 61 is a voice coil motor. In one embodiment, the lens base 61 is a mechanical mount.

The lens module 100 further includes a first adhesive layer 71 disposed between the filter 50 and the support portion 422. The first adhesive layer 71 adheres the filter 50 to the support portion 422. The lens module 100 further includes a second adhesive layer 72 disposed between the mounting bracket 40 and the lens unit 60. The second adhesive layer 72 fixedly couples the lens unit 60 to the mounting bracket 40.

Since the signal line 30 is disposed on the second circuit board 12, the height of the signal line 30 may be lower than the height of the first circuit board 11. Compared with the existing lens module, the height of the signal line 30 is reduced, so that the mounting bracket 40 does not require extra space to accommodate the signal line 30. Thus, a height of the support portion 422 and the filter 50 can is reduced, and a back focal length (BFL) of the lens 62 is reduced, thereby reducing a thickness of the lens module 100.

Figure 4:
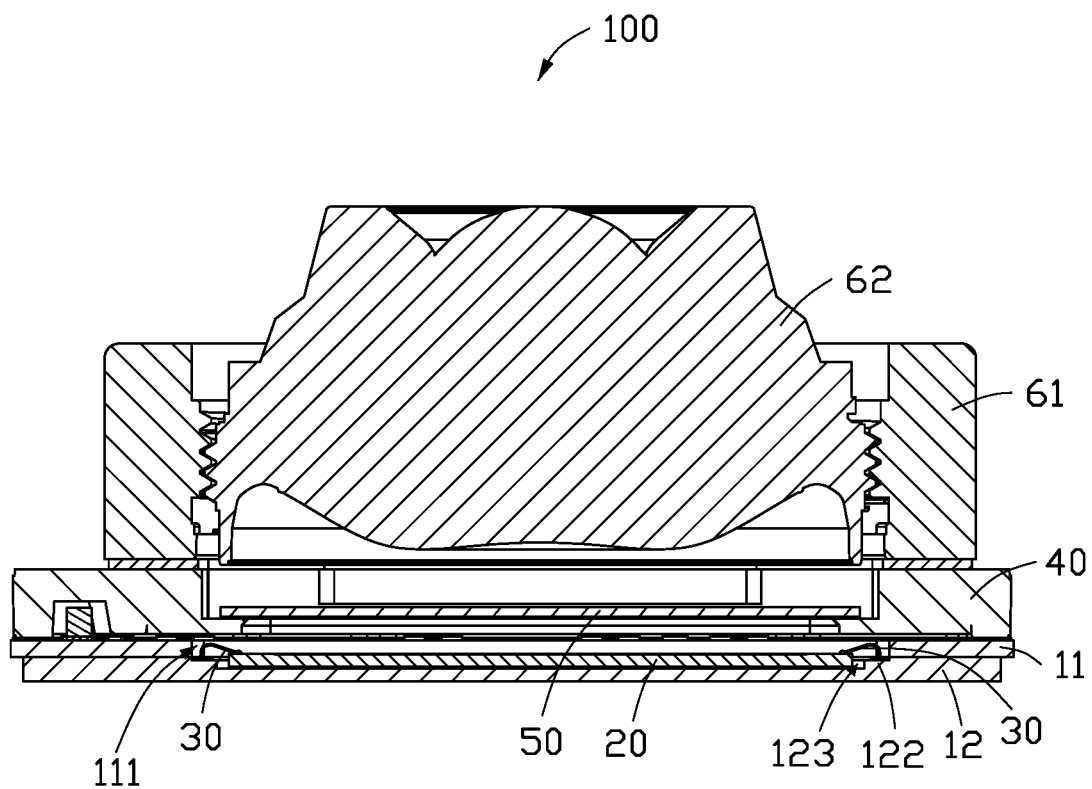
FIG. 4 is similar to FIG. 3, but showing a second embodiment of the lens module.

FIG. 4 shows a cross-sectional view of another embodiment of a lens module 100. Similar to the lens module 100 provided by the foregoing embodiment, the circuit board 10 includes a first circuit board 11 and a second circuit board 12, and a first through hole 111 is defined in a middle portion of the first circuit board 11. A groove 123 corresponding to the first through hole 111 is defined in a middle of the second circuit board 12, and the image sensor 20 is received in the groove 123. A width of the first through hole 111 is larger than a width of the groove 123, such that a portion of the second circuit board 12 adjacent to the groove 123 is not shielded by the first circuit board 11, thereby forming a signal line connecting portion 122.

One end of the signal line 30 is disposed on the signal line connecting portion 122 of the second circuit board 12, and a second end of the signal line 30 is coupled to the image sensor 20.

In one embodiment, the first circuit board 11 and the second circuit board 12 are ceramic substrates.

The lens module 100 provided by the second embodiment also reduces a thickness of the lens module.

In addition, the image sensor 20 is covered by the mounting bracket 20 and the filter 50 to achieve a dustproof effect. A degree of freedom in module design is higher, and a short back focus lens 62 and a relatively thick filter 50 can be selected.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A lens module comprising:
a first circuit board defining a first through hole;
a second circuit board adhered to and electrically coupled to the first circuit board, the second circuit board defining a second through hole aligned with the first through hole, a width of the first through hole being larger than a width of the second through hole;
an image sensor received in the second through hole;
a signal line, one end of the signal line disposed on the second circuit board, and another end of the signal line coupled to the image sensor;
a mounting bracket disposed on a side of the first circuit board facing away from the second circuit board;
a filter disposed on the mounting bracket; and
a lens unit disposed on the mounting bracket;
wherein a portion of the second circuit board adjacent to the second through hole is not covered by the first circuit board and forms a signal line connecting portion; the one end of the signal line is disposed on the signal line connecting portion.

2. The lens module of claim 1, wherein:
a top of the signal line is received in the first through hole.

3. The lens module of claim 1, further comprising a conductive adhesive layer between the first circuit board and the second circuit board, wherein:
the first circuit board is a printed circuit board; and
the second circuit board is a flexible printed circuit.

4. The lens module of claim 3, further comprising a reinforcement plate disposed on a side of the second circuit board facing away from the first circuit board, wherein:
the image sensor is adhered to the reinforcement plate.

5. The lens module of claim 4, wherein;
the reinforcement plate is a steel plate.

6. The lens module of claim 1, wherein:
a mounting hole is defined in a middle of the mounting bracket; and
the mounting bracket comprises a sidewall surrounding the mounting hole.

7. The lens module of claim 6, wherein:
the sidewall comprises a side surface and a support portion perpendicular to the side surface; and
the filter is disposed on the support portion and faces the image sensor.

8. The lens module of claim 1, wherein:
the lens unit comprises a lens base and a lens;
the lens base is disposed on the mounting bracket and defines a receiving hole; and
the lens is mounted and received within the receiving hole.

9. The lens module of claim 8, further comprising:
a first adhesive layer between the filter and the mounting bracket; and
a second adhesive layer between the mounting bracket and the lens base.

10. The lens module of claim 1, wherein:
the first circuit board and the second circuit board are ceramic substrates.

11. A lens module comprising:
a first circuit board defining a first through hole;
a second circuit board adhered to and electrically coupled to the first circuit board, the second circuit board defining a groove aligned with the first through hole, a width of the first through hole being larger than a width of the groove;
an image sensor received in the groove;
a signal line, one end of the signal line disposed on the second circuit board, and another end of the signal line coupled to the image sensor;
a mounting bracket disposed on a side of the first circuit board facing away from the second circuit board;
a filter disposed on the mounting bracket; and
a lens unit disposed on the mounting bracket;
wherein a portion of the second circuit board adjacent to the groove is not covered by the first circuit board and forms a signal line connecting portion; the one end of the signal line is disposed on the signal line connecting portion.

12. The lens module of claim 11, wherein:
a top of the signal line is received in the first through hole.

13. The lens module of claim 11, further comprising a conductive adhesive layer between the first circuit board and the second circuit board, wherein:
the first circuit board is a printed circuit board; and
the second circuit board is a flexible printed circuit.

14. The lens module of claim 13, further comprising a reinforcement plate disposed on a side of the second circuit board facing away from the first circuit board, wherein:
the image sensor is adhered to the reinforcement plate.

15. The lens module of claim 14, wherein:
the reinforcement plate is a steel plate.

16. The lens module of claim 11, wherein:
a mounting hole is defined in a middle of the mounting bracket;
the mounting bracket comprises a sidewall surrounding the mounting hole.

17. The lens module of claim 16, wherein:
the sidewall comprises a side surface and a support portion perpendicular to the side surface; and
the filter is disposed on the support portion and faces the image sensor.

18. The lens module of claim 17, wherein:
the lens unit comprises a lens base and a lens;
the lens base is disposed on the mounting bracket and defines a receiving hole; and
the lens is mounted and received within the receiving hole;
the lens module further comprises:
a first adhesive layer between the filter and the mounting bracket; and
a second adhesive layer between the mounting bracket and the lens base.

* * * * *